US 7,115,984 B2

(12) United States Patent
Poo et al.

(10) Patent No.: US 7,115,984 B2
(45) Date of Patent: Oct. 3, 2006

(54) SEMICONDUCTOR DEVICES INCLUDING PERIPHERALLY LOCATED BOND PADS, INTERMEDIATES THEREOF, ASSEMBLIES, AND PACKAGES INCLUDING THE SEMICONDUCTOR DEVICES, AND SUPPORT ELEMENTS FOR THE SEMICONDUCTOR DEVICES

(75) Inventors: Chia Yong Poo, Singapore (SG); Boon Suan Jeung, Singapore (SG); Low Siu Waf, Singapore (SG); Chan Min Yu, Singapore (SG); Neo Yong Loo, Singapore (SG); Chua Swee Kwang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/736,244

(22) Filed: Dec. 15, 2003

(65) Prior Publication Data

US 2004/0124523 A1 Jul. 1, 2004

Related U.S. Application Data

(62) Division of application No. 10/183,820, filed on Jun. 27, 2002, now Pat. No. 6,727,116.

(30) Foreign Application Priority Data

Jun. 18, 2002 (SG) .............................. 200203688-7

(51) Int. Cl.
*H01L 23/02* (2006.01)
*H01L 23/48* (2006.01)

(52) U.S. Cl. .............. 257/698; 257/696; 257/684; 257/673; 257/686; 257/685; 257/690; 257/691; 257/666; 257/784; 257/786; 257/787; 257/777; 361/777; 174/22; 174/257; 174/52.4; 174/52.2

(58) Field of Classification Search ............ 257/777, 257/696, 684–687, 690–693, 698, 673, 796, 257/784, 786, 787; 361/777; 174/262, 257, 174/52.4, 52.2
See application file for complete search history.

(56) References Cited

U.S. PATENT DOCUMENTS

| 4,956,694 A | | 9/1990 | Eide | |
| 5,138,115 A | * | 8/1992 | Lam | .......................... 174/52.4 |

(Continued)

FOREIGN PATENT DOCUMENTS

JP          59-27549      *    2/1984

(Continued)

OTHER PUBLICATIONS

NN81055595: Edge Mounted MLC Packaging Scheme. May 1981; IBM Technical Disclosure Buletin, May 1981 US: vol. 23, Issue # 12, p. # 5595-5598; Publication Date: May 1, 1981.*

(Continued)

*Primary Examiner*—Alexander Oscar Williams
(74) *Attorney, Agent, or Firm*—TraskBritt

(57) ABSTRACT

A semiconductor device package is disclosed which is substantially die-sized with respect to each of the X, Y and Z axes. The package includes outer connectors that are located along at least one peripheral edge thereof and that extend substantially across the height of the peripheral edge. Each outer connector is formed by severing a conductive via that extends substantially through a substrate blank, such as a silicon wafer, at a street located adjacent to an outer periphery of the semiconductor device of the package. The outer connectors may include recesses that at least partially receive conductive columns protruding from a support substrate therefor. Assemblies may include the packages in stacked arrangement, without height-adding connectors.

10 Claims, 7 Drawing Sheets

U.S. PATENT DOCUMENTS

| | | | |
|---|---|---|---|
| 5,266,833 A * | 11/1993 | Capps | 257/690 |
| 5,313,096 A * | 5/1994 | Eide | 257/686 |
| 5,434,745 A * | 7/1995 | Shokrgozar et al. | 361/735 |
| 5,502,667 A | 3/1996 | Bertin et al. | |
| 5,541,450 A | 7/1996 | Jones et al. | |
| 5,639,695 A | 6/1997 | Jones et al. | |
| 5,723,901 A * | 3/1998 | Katsumata | 257/686 |
| 5,752,182 A * | 5/1998 | Nakatsuka et al. | 455/333 |
| 5,834,162 A * | 11/1998 | Malba | 430/317 |
| 5,925,924 A * | 7/1999 | Cronin et al. | 257/622 |
| 5,986,209 A | 11/1999 | Tandy | |
| 6,004,867 A | 12/1999 | Kim et al. | |
| 6,034,438 A | 3/2000 | Petersen | |
| 6,072,236 A * | 6/2000 | Akram et al. | 257/698 |
| 6,228,684 B1 | 5/2001 | Maruyama | |
| 6,252,300 B1 | 6/2001 | Hsuan et al. | |
| 6,323,546 B1 | 11/2001 | Hsuan et al. | |
| 6,335,225 B1 * | 1/2002 | Doan | 438/123 |
| 6,352,923 B1 | 3/2002 | Hsuan et al. | |
| 6,358,833 B1 * | 3/2002 | Akram et al. | 438/613 |
| 6,379,982 B1 * | 4/2002 | Ahn et al. | 438/14 |
| 6,379,999 B1 | 4/2002 | Tanabe | |
| 6,461,956 B1 | 10/2002 | Hsuan et al. | |
| 6,521,485 B1 | 2/2003 | Su et al. | |
| 6,521,995 B1 | 2/2003 | Akram et al. | |
| 6,552,426 B1 | 4/2003 | Ishio et al. | |
| 6,582,992 B1 * | 6/2003 | Poo et al. | 438/109 |
| 6,611,052 B1 * | 8/2003 | Poo et al. | 257/686 |
| 6,656,827 B1 * | 12/2003 | Tsao et al. | 438/612 |
| 6,710,454 B1 | 3/2004 | Boon | |
| 6,841,418 B1 | 1/2005 | Jeung et al. | |
| 6,849,802 B1 * | 2/2005 | Song et al. | 174/52.4 |
| 6,855,572 B1 * | 2/2005 | Jeung et al. | 438/106 |
| 6,856,023 B1 * | 2/2005 | Muta et al. | 257/774 |
| 6,876,061 B1 | 4/2005 | Zandman et al. | |
| 2001/0009300 A1 * | 7/2001 | Sugimura | 257/693 |
| 2001/0042901 A1 | 11/2001 | Maruyama | |
| 2002/0017398 A1 * | 2/2002 | Hacke et al. | 174/260 |
| 2002/0079567 A1 | 6/2002 | Lo et al. | |
| 2003/0080398 A1 | 5/2003 | Badehi | |
| 2003/0102160 A1 * | 6/2003 | Gaudiello et al. | 174/262 |
| 2003/0134453 A1 | 7/2003 | Prabhu et al. | |
| 2003/0162326 A1 * | 8/2003 | Tsubosaki et al. | 438/109 |
| 2003/0230802 A1 | 12/2003 | Poo et al. | |
| 2003/0232482 A1 | 12/2003 | Poo et al. | |
| 2004/0140573 A1 | 7/2004 | Pu et al. | |
| 2004/0156177 A1 * | 8/2004 | Higashitani | 361/777 |
| 2004/0251525 A1 | 12/2004 | Zilber et al. | |

FOREIGN PATENT DOCUMENTS

| | | | | |
|---|---|---|---|---|
| JP | 59-43556 | * | 3/1984 | 257/E23.124 |
| JP | 63-232342 | * | 9/1988 | 257/690 |
| JP | 5-75014 | * | 3/1993 | |
| JP | 6-97225 | * | 4/1995 | 257/690 |
| JP | 2001-44361 | * | 2/2001 | |
| JP | 2001-210521 | * | 8/2001 | |
| JP | 2003-8066 | * | 1/2003 | |

OTHER PUBLICATIONS

Australian Search Report, Apr. 15, 2005, 5 pages.
U.S. Appl. No. 10/717,421, filed Nov. 19, 2003.

* cited by examiner

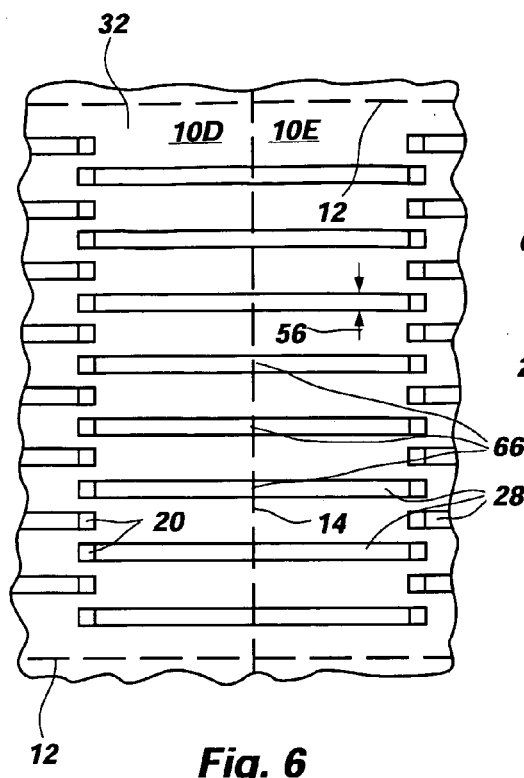
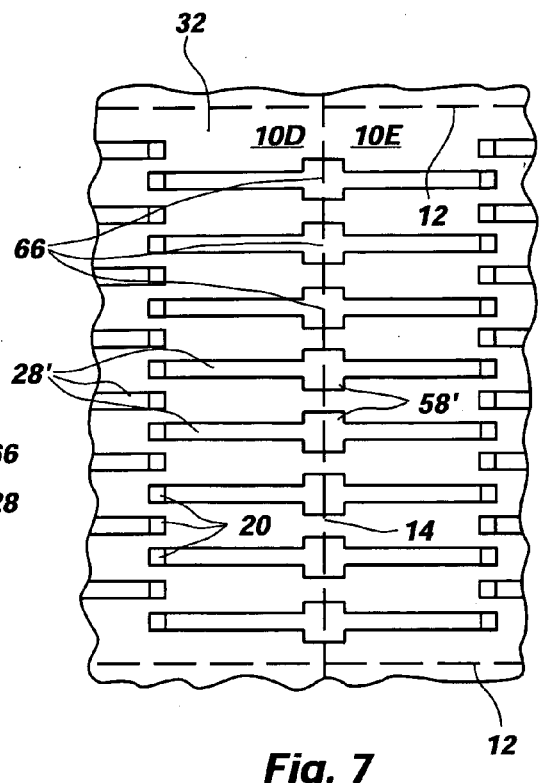
Fig. 6
Fig. 7
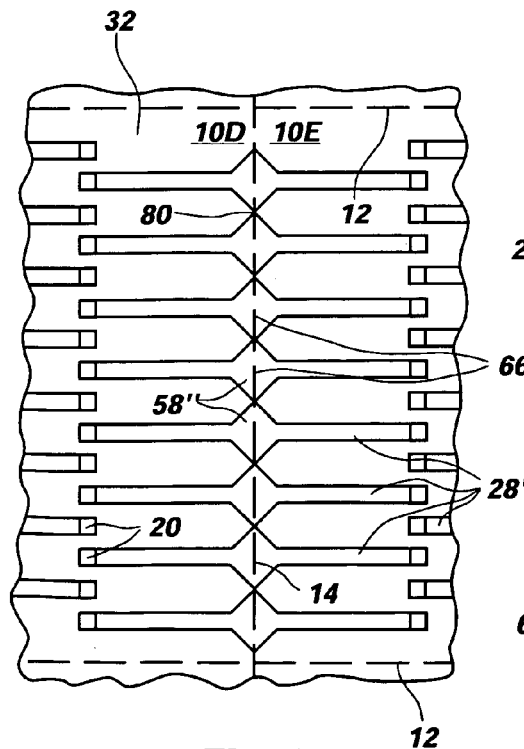
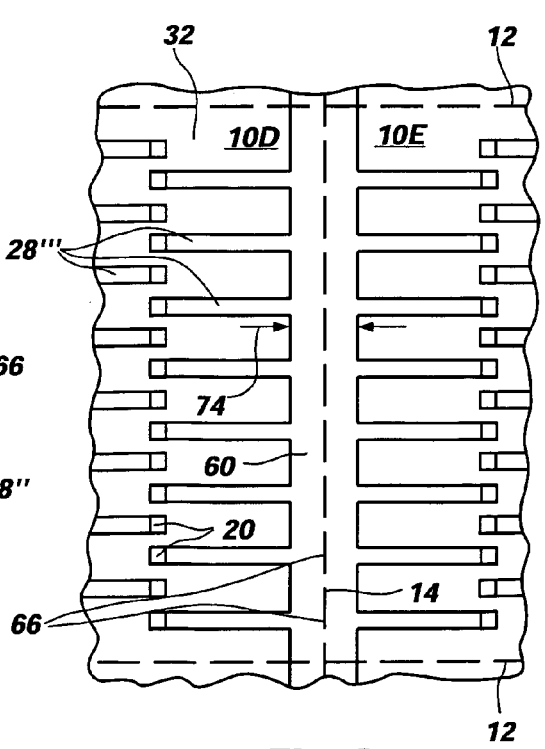
Fig. 8
Fig. 9

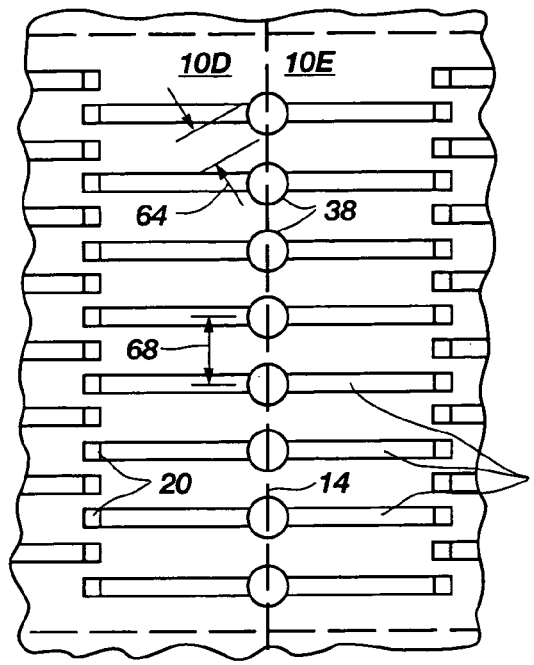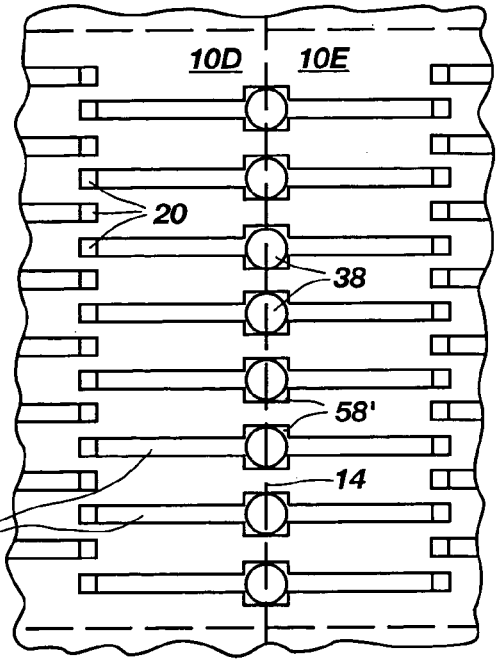
Fig. 10          Fig. 11
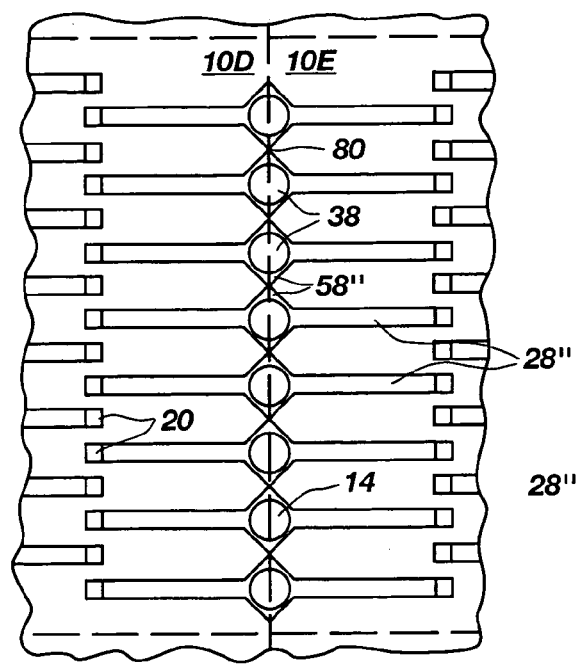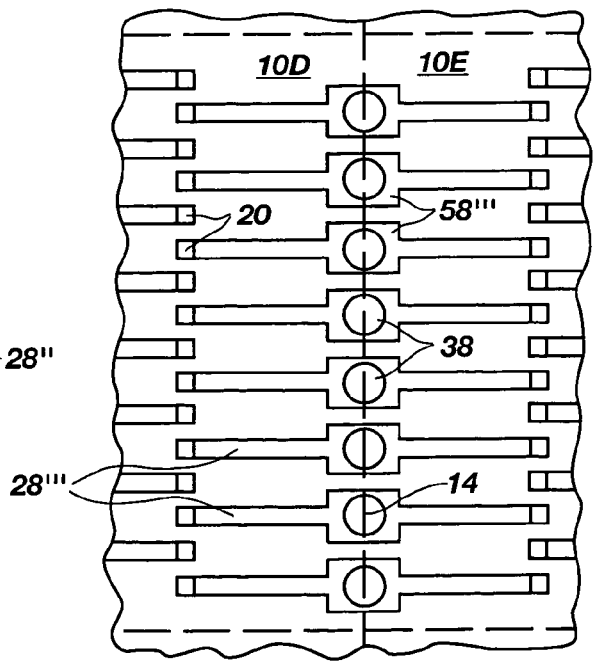
Fig. 12          Fig. 13

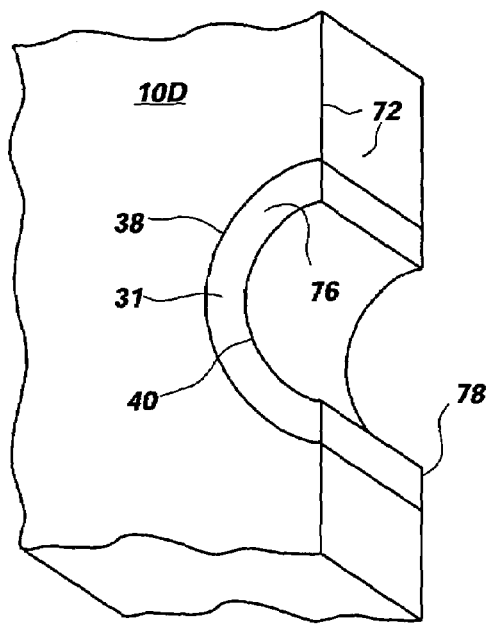
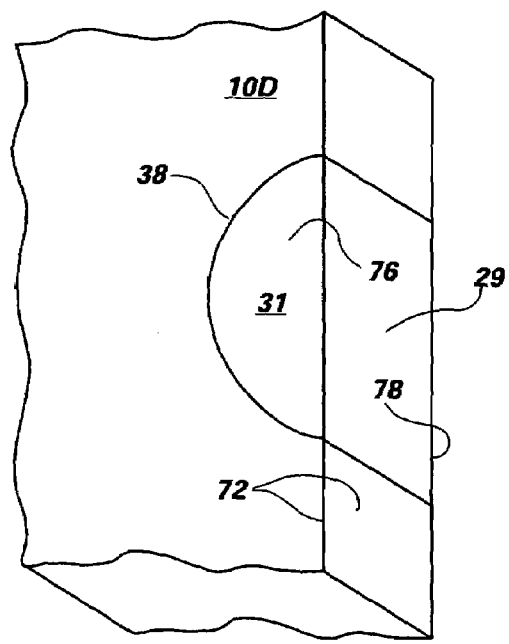
Fig. 15              Fig. 16
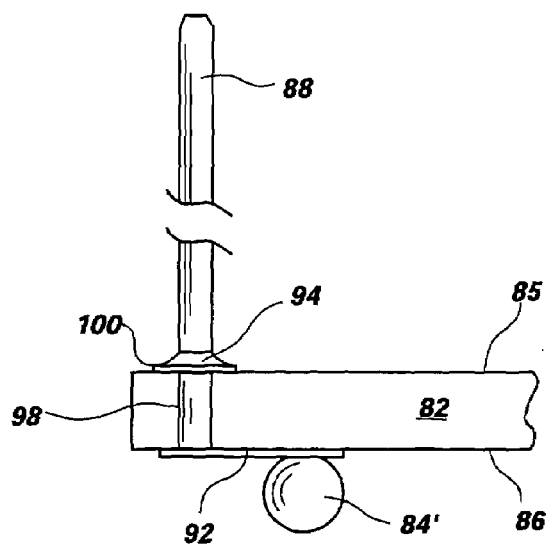
Fig. 19

SEMICONDUCTOR DEVICES INCLUDING PERIPHERALLY LOCATED BOND PADS, INTERMEDIATES THEREOF, ASSEMBLIES, AND PACKAGES INCLUDING THE SEMICONDUCTOR DEVICES, AND SUPPORT ELEMENTS FOR THE SEMICONDUCTOR DEVICES

CROSS-REFERENCE TO RELATED APPLICATION

This application is a divisional of application Ser. No. 10/183,820 filed Jun. 27, 2002, now U.S. Pat. No. 6,727,116, issued Apr. 27, 2004.

BACKGROUND OF THE INVENTION

1. Field of the Invention

The present invention relates generally to packaged semiconductor devices with a low profile. More specifically, the invention pertains to wafer-level packages having a true chip profile or both a chip profile and a chip footprint.

The dimensions of many different types of state-of-the-art electronic devices are ever decreasing. To reduce the dimensions of electronic devices, the structures by which the microprocessors, memory devices, other semiconductor devices, and other electronic components of these devices are packaged and assembled with carriers, such as circuit boards, must become more compact. In general, the goal is to economically produce a chip-scale package (CSP) of the smallest size possible, and with conductive structures, such as leads, pins, or conductive bumps, which do not significantly contribute to the overall size in the X, Y, or Z dimensions, all while maintaining a very high performance level.

One approach to reducing the sizes of assemblies of semiconductor devices and circuit boards has been to minimize the profiles of the semiconductor devices and other electronic components upon carrier substrates (e.g., circuit boards) so as to reduce the distances the semiconductor devices protrude from the carrier substrates. Various types of packaging technologies have been developed to facilitate orientation of semiconductor devices upon carrier substrates in this manner.

Conventionally, semiconductor device packages are multilayered structures, typically including a bottom layer of encapsulant material, a carrier (e.g., leads, a circuit board, etc.), a semiconductor, die, and a top layer of encapsulant material, for example. In addition, the leads, conductive bumps, or pins of conventional semiconductor device packages, which electrically connect such packages to carrier substrates, as well as provide support for the packages, are sometimes configured to space the semiconductor device packages apart from a carrier substrate. As a result, the overall thicknesses of these semiconductor device packages and the distances the packages protrude from carrier substrates are greater than is often desired for use in state-of-the-art electronic devices.

Wafer-level packaging (WLP) refers to packaging of an electronic component while it is still part of a wafer. The packages that are formed by WLP processes are generally considered to be "chip-sized" packages, at least with respect to the lateral X and Y dimensions, i.e., "footprint", but typically have somewhat enlarged profiles in the Z dimension due to the solder balls, pins, or other conductive structures that protrude therefrom. Likewise, modules of stacked dice may use interdie connections comprising solder balls, pins, etc., which substantially contribute to the overall Z dimension, i.e., profile.

"Flip-chip" technology, as originating with controlled-collapse chip connection (C-4) technology, is an example of an assembly and packaging technology that results in a semiconductor device being oriented substantially parallel to a carrier substrate, such as a circuit board. In flip-chip technology, the bond pads or contact pads of a semiconductor device are arranged in an array over a major surface of the semiconductor device. Flip-chip techniques are applicable to both bare and packaged semiconductor devices. A packaged flip-chip type semiconductor device, which typically has solder balls arranged in a so-called "ball grid array" (BGA) connection pattern, typically includes a semiconductor die and a carrier substrate, which is typically termed an "interposer". The interposer may be positioned adjacent either the back side of the semiconductor die or the active (front) surface thereof.

When the interposer is positioned adjacent the back side of the semiconductor die, the bond pads of the semiconductor die are typically electrically connected by way of wire bonds or other intermediate conductive elements to corresponding contact areas on a top side of the interposer. These contact areas communicate with corresponding bumped contact pads on the back side of the interposer. This type of flip-chip assembly is positioned adjacent a higher-level carrier substrate with the back side of the interposer facing the carrier substrate.

If the interposer is positioned adjacent the active surface of the semiconductor die, the bond pads of the semiconductor die may be electrically connected to corresponding contact areas on an opposite, top surface of the interposer by way of intermediate conductive elements that extend through one or more holes formed in the interposer. Again, the contact areas communicate with corresponding contact pads on the interposer. In this type of flip-chip semiconductor device assembly, however, the contact pads are also typically located on the top surface of the interposer. Accordingly, this type of flip-chip assembly is positioned adjacent a higher-level carrier substrate, such as a printed circuit board, by orienting the interposer with the top surface facing the carrier substrate.

In each of the foregoing types of flip-chip semiconductor devices, the contact pads of the interposer are disposed in an array that has a footprint that mirrors an arrangement of corresponding terminals or other contact regions formed on a carrier substrate. Each of the bond (on bare flip-chip semiconductor dice) or contact (on flip-chip packages) pads and its corresponding terminal may be electrically connected to one another by way of a conductive structure, such as a solder ball, that also spaces the interposer some distance away from the carrier substrate.

The space between the interposer and the carrier substrate may be left open or filled with a so-called "underfill" dielectric material that provides additional electrical insulation between the semiconductor device and the carrier substrate. In addition, each of the foregoing types of flip-chip semiconductor devices may include an encapsulant material covering portions or substantially all of the interposer and/or the semiconductor die.

The thicknesses of conventional flip-chip type packages having ball grid array connection patterns are defined by the combined thicknesses of the semiconductor die, the interposer, the adhesive material therebetween, and the conductive structures (e.g., solder balls) that protrude above the interposer or the semiconductor die. As with the flat packages, conventional flip-chip type packages are often undesirably thick for use in small, thin, state-of-the-art electronic devices. Furthermore, use of this general construction method for producing a stacked multichip module (MCM) results in a relatively high-profile, large footprint device.

Thinner, or low-profile, flip-chip type packages have been developed which include interposers or other carriers with recesses that are configured to receive at least a portion of the profiles of semiconductor devices. While interposers that include recesses for partially receiving semiconductor devices facilitate the fabrication of thinner flip-chip type packages, the semiconductor dice of these packages, as well as intermediate conductive elements that protrude beyond the outer surfaces of either the semiconductor dice or the interposers, undesirably add to the thicknesses of these packages.

U.S. Pat. Nos. 5,541,450 and 5,639,695, both issued to Jones et al. (hereinafter "the '450 and '695 patents"), disclose another type of flip-chip type package, which includes an interposer with a semiconductor die receptacle extending completely therethrough. The '695 patent teaches a package that may be formed by securing a semiconductor die directly to a carrier substrate and electrically connecting the interposer to the carrier substrate before the semiconductor die is electrically connected to the interposer. The semiconductor die, intermediate conductive elements that connect bond pads of the semiconductor die to corresponding contact areas on the interposer, and regions of the interposer adjacent the receptacle may then be encapsulated. While this method results in a very low-profile flip-chip type package, the package cannot be tested separately from the carrier substrate. As a result, if the package is unreliable, it may also be necessary to discard the carrier substrate and any other components thereon. Moreover, the packaging method of the '695 patent complicates the process of connecting semiconductor devices and other electronic components to a carrier substrate. In addition, it should be noted that in order to obtain a low-profile package, it may be necessary to sacrifice footprint compactness. The footprint area of such a low-profile package may be significantly greater than the area of the semiconductor die thereof.

Thus, there is a need for semiconductor device packages that have dimensions that closely resemble the corresponding dimensions of a semiconductor device of such packages, as well as for packaging methods.

SUMMARY OF THE INVENTION

In the present invention, semiconductor devices include bond pads, or outer connectors, that are located on one or more peripheral edges thereof. The outer connectors, which facilitate electrical connection of the semiconductor device to a substrate, such as a test substrate or a carrier substrate (e.g., an interposer or a printed circuit board), may be arranged on a peripheral edge of the semiconductor device in such a way as to impart the semiconductor device with a castellated appearance. Optionally, the outer connectors may include recesses that extend substantially from one major surface of the semiconductor device to another, opposite major surface of the semiconductor device.

By way of example only, the outer connectors may be fabricated by forming redistribution circuitry over active surfaces of semiconductor devices that have yet to be severed from a fabrication substrate, such as a full or partial wafer of semiconductive material (e.g., silicon, gallium arsenide, indium phosphide, etc.) or a full or partial, so-called silicon-on-insulator (SOI) type substrate (e.g., a silicon-on-ceramic (SOC) substrate, silicon-on-glass (SOG) substrate, silicon-on-sapphire (SOS) substrate, etc.). The redistribution circuitry extends from bond pad locations on the active surface of each semiconductor device on the fabrication substrate to a boundary, or "street", between that semiconductor device and an adjacent semiconductor device. At the boundary, electrically conductive vias which extend substantially through the thickness of the substrate are formed. The electrically conductive vias may comprise a solid quantity of conductive material or have hollow portions extending substantially along the lengths thereof. Upon severing the adjacent semiconductor devices from one another, which is typically referred to in the art as "dicing", each conductive via is bisected, creating outer connectors that are positioned on the resulting peripheral edge of the singulated or diced semiconductor device.

As outer connectors formed in this manner extend substantially from an active surface to the back side of the semiconductor device, portions of each outer connector may be exposed at both the active surface and the back side of the semiconductor device. Accordingly, either the active surface or the back side of a semiconductor device of the present invention may be joined and electrically connected to one or more other semiconductor devices or semiconductor device components (e.g., test substrates, carrier substrates, etc.).

Assembly of a semiconductor device according to the present invention with another semiconductor device or semiconductor device component may be accomplished without any significant intervening space between the assembled semiconductor devices or semiconductor device and semiconductor device component. In assembling a semiconductor device of the present invention with another semiconductor device or a semiconductor device component, the outer connectors of the semiconductor device and corresponding contacts of the other semiconductor device or semiconductor device component are aligned, then electrically connected with one another. Accordingly, semiconductor devices that include such outer connectors may facilitate the formation of assemblies and packages with minimal footprints (X and Y dimensions) as well as a minimal profile (Z dimension).

An example of a semiconductor device assembly that may include more than one semiconductor device that incorporates teachings of the present invention may comprise a so-called "multiple-chip module" of stacked configuration. Aligned, corresponding outer connectors of the two or more stacked semiconductor devices may be conductively connected to one another, such as by solder or by conductive pins or other structures that are at least partially received within receptacles of the outer connectors. As the outer connectors extend from the active surface to the back side of each of the semiconductor devices and since electrical connection may be effected at the peripheries of the semiconductor devices, the opposed back side and active surface of adjacent semiconductor devices may be positioned very closely to one another. Thus, a multichip module according to the present invention may comprise a stack of a large number of dice or packages, while avoiding the use of undesirable height-adding interdie connectors, such as solder balls, bond wires, and the like. As a result, a multichip module that includes semiconductor devices of the present invention may have a minimum profile dimension (Z dimension).

Additionally, a multichip module that includes semiconductor devices according to the present invention may include a support substrate which has a footprint which is substantially equal in size (i.e., X and Y dimensions) to or only slightly larger than the footprint of the remainder of the multichip module. The support substrate may include conventional contacts (e.g., bond pads if the support substrate is an interposer or another semiconductor device, terminals if the support substrate is a circuit board, contact areas on leads if the support substrate comprises leads, etc.) to which outer connectors of the semiconductor devices are electrically connected. By way of example only, each contact of the support substrate and the corresponding outer connectors of the semiconductor devices may be electrically connected to one another (e.g., secured to a contact of the support substrate and located between adjacent surfaces of corresponding, adjacent outer connectors and/or within recesses of corresponding, adjacent outer connectors) by way of a conductive material (e.g., solder, a conductive or conductor-filled elastomer, etc.), by way conductive pins or other elongate conductive structures (e.g., upwardly standing wires) that are secured to and protrude from the contact and that are at least partially received within receptacles of the corresponding outer connectors, or otherwise, as known in the art.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, in which some dimensions may be exaggerated, exemplary embodiments for carrying out the invention are illustrated:

FIGS. 6, 7, 8 and 9 are partial plan views of various exemplary redistribution conductive tracing patterns along adjacent semiconductor devices on a fabrication substrate;

FIGS. 10, 11, 12 and 13 are partial plan views of the redistribution conductive tracing patterns of FIGS. 6, 7, 8, and 9, respectively, following patterning thereof and formation of full via holes therein in accordance with the teachings of the invention;

FIG. 15 is an enlarged perspective view of an outer connector formed in accordance with the teachings of the invention;

FIG. 16 is an enlarged perspective view of another embodiment of an outer connector formed in accordance with the teachings of the invention;

FIG. 19 is an enlarged cross-sectional view through a portion of a support substrate for a multichip module in accordance with teachings of the invention; and FIGS. 20, 21 and 22 are enlarged plan views of portions of outer connectors of packages, illustrating differing configurations of conductive elements for establishing electrical connections with the outer connectors.

DETAILED DESCRIPTION OF THE INVENTION

Figure 1:
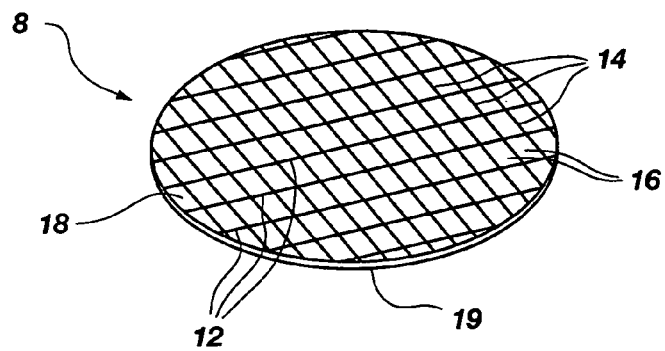
FIG. 1 is a perspective view of a fabrication substrate with multiple semiconductor devices fabricated thereon in accordance with teachings of the present invention.
Figure 2:
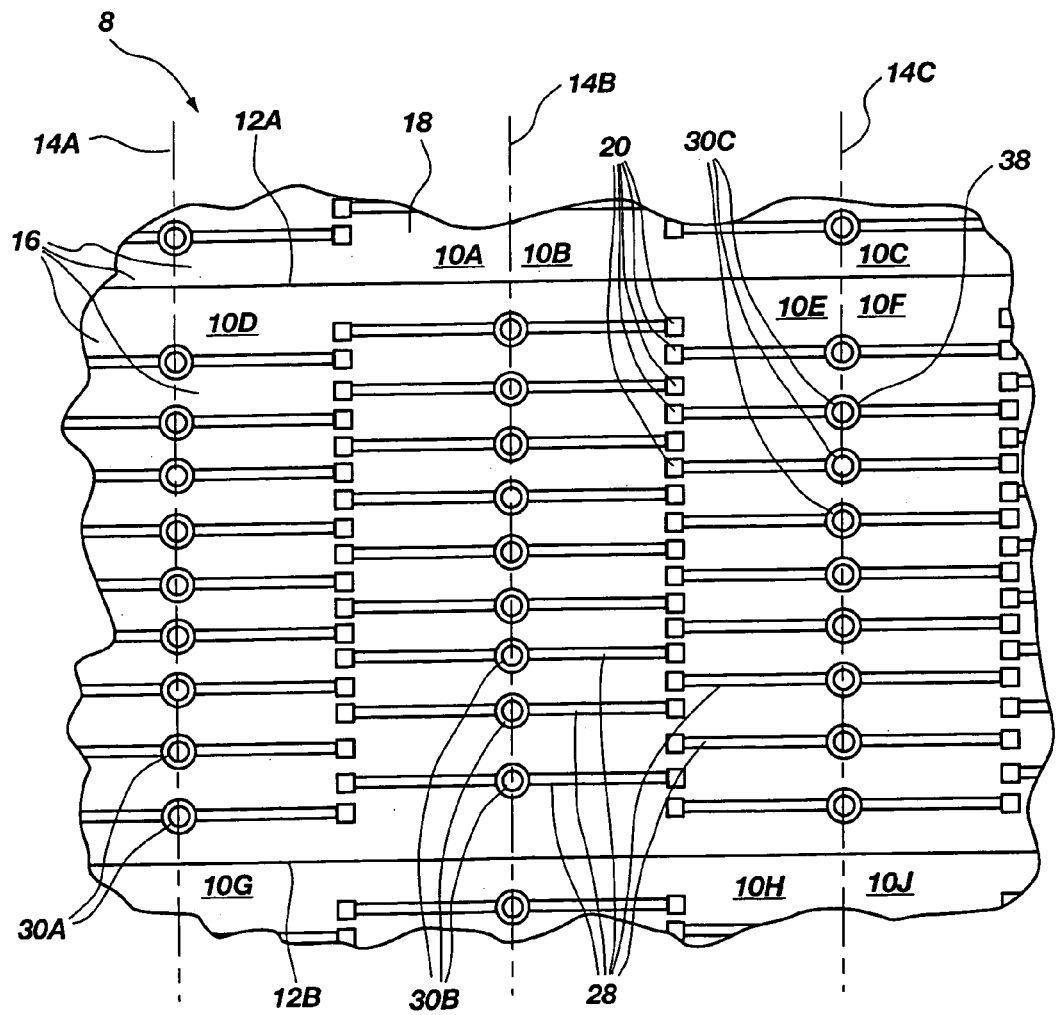
FIG. 2 is a plan view of an enlarged portion of the exemplary fabrication substrate of FIG. 1, with multiple semiconductor devices fabricated thereon in accordance with teachings of the invention, each semiconductor device including bond pads that are arranged in-line along a central portion of the semiconductor device, which bond pads are redistributed to outer connectors that are positioned on opposite peripheral edges thereof.

Referring to FIGS. 1 and 2, a fabrication substrate, which is also referred to herein as a substrate blank 8, is shown. One side of the substrate blank 8 is selected as an active surface 18 and the opposite side becomes the back side 19. A pattern of straight boundary lines or streets 12 and 14 (individually referred to herein as streets 12A, 12B, 12C, etc., and 14A, 14B, 14C, etc., respectively), which respectively extend in the X direction and Y direction, is delineated for subdivision of the substrate blank 8 into a plurality of areas at which separate semiconductor devices 16 are to be fabricated and further processed to form packages 10 (individually referred to as packages 10A, 10B, 10C, etc.). Streets 12 and 14 also comprise saw lines for the subsequent singulation of each package 10 from other packages 19 that have been fabricated on the substrate blank 8. For example, in FIG. 2, a package 10E is shown as being surrounded by immediately adjacent packages 10A, 10B, 10C, 10D, 10F, 10G, 10H and 10J that are carried upon the same, yet-to-be severed substrate blank 8.

Semiconductor devices 16 and, thus, assembled packages 10 that include semiconductor devices 16, may comprise any type of device, such as a memory device (e.g., dynamic random access memory (DRAM), static random access memory (SRAM), programmable memory (PROM), electrically erasable programmable memory (EEPROM), flash memory, etc.), a processor, or any other type of semiconductor device known in the art. Semiconductor device 16 includes bond pads 20 (see, e.g., FIGS. 2-5) that facilitate electrical communication between the integrated circuitry (not shown) thereof and external electronic components, as known in the art. Bond pads 20 may be arranged on an active surface 18 of each semiconductor device 16 in any suitable fashion known in the art, such as in-line along a central portion of the semiconductor device 16 or an edge of package 10 thereof, peripherally, or in an area array.

The fabrication of semiconductor devices 16 may be effected in accordance with the desired end use of the assembled package 10 of which each semiconductor device is intended to be a part. An integrated circuit (not shown) is formed in each semiconductor device. 16 to interface with the active surface 18, as known in the art. A wide variety of integrated circuit device elements may be used in the semiconductor device 16 of a package 10, including, for example, conductors, resistors, transistors, capacitors, inductors, insulators, and the like. Fabrication processes are used which typically fall into the groups known as layering, patterning, doping and heating, and many specific variations of each are well known. For example, useful layering processes include various methods of oxidation, chemical vapor deposition (CVD), molecular beam epitaxy, physical vapor deposition (PVD), and other techniques.

In the exemplary embodiment depicted in FIG. 2, each semiconductor device 16 on substrate blank 8 is provided with bond pads 20 to facilitate electrical connection of the integrated circuitry (not shown) of that semiconductor device 16 with external components, such as other semiconductor devices or electronic components. The bond pads 20 are located so as not to interfere with subsequently fabricated outer connectors 31 (FIGS. 3–5) of a package 10 of which the semiconductor device 16 is a part.

In addition to a semiconductor device 16 (FIG. 1), the packages 10A, 10B, 10C, 10D, 10E, etc., on the substrate blank 8 each include conductive traces 28 that extend between various bond pads 20 and, prior to severing the packages 10A, 10B, 10C, 10D, 10E, etc., from one another, corresponding conductive vias 30, such as vias 30A, 30B, 30C, which are depicted, by way of example only, as being annular in shape. The conductive vias 30 extend completely through the thickness of the substrate blank 8 and, thus, through the entire thickness of the package 10 of which they will become a part. For each conductive via 30 that is located between adjacent, functional semiconductor devices 16, a conductive trace 28 extends from a bond pad 20 of each of the adjacent, functional semiconductor devices 16 to that conductive via 30. Each of the conductive vias 30 is positioned along a street 12, 14 (in this example, streets 14A, 14B, 14C, etc.) on the substrate blank 8. Each conductive via 30 also extends laterally into at least a portion of the semiconductor devices 16 between which it is positioned. For example, packages 10E and 10F share conductive vias 30C on the boundary line 14C between the two packages 10E and 10F. Package 10D also shares conductive vias 30B with package 10E.

Figure 3:
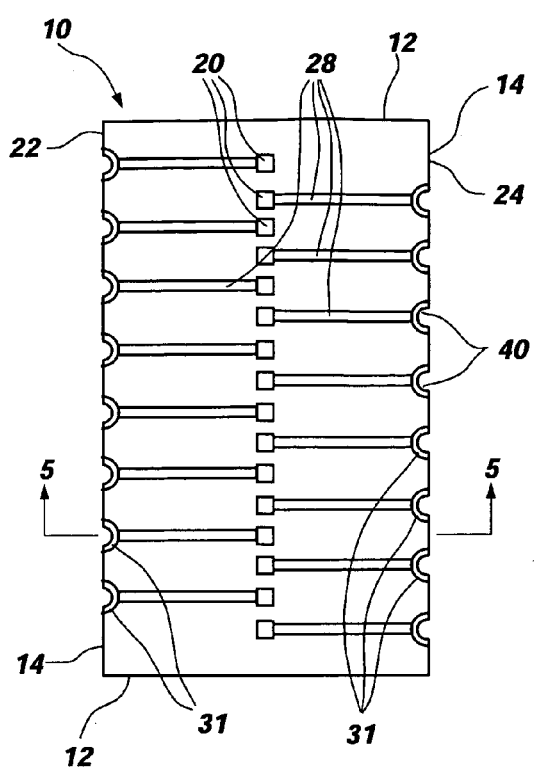
FIG. 3 is a plan view of a semiconductor device according to the present invention following singulation thereof from the fabrication substrate of FIG. 2.

Singulation of the packages 10 from one another and from the substrate blank 8 is effected by cutting the substrate blank 8 along boundary lines 12 and 14 thereon. As substrate blank 8 is cut along streets 12 and 14, the full conductive vias 30 that are positioned on a cut street 12, 14 are cut into outer connectors 31, which remain at the peripheral edges 22 of each of the singulated packages 10, as shown in FIG. 3. A package 10 which has been singulated from the substrate blank 8, or "wafer level", of FIG. 2 has outer connectors 31 inlaid into opposite peripheral edges 22, 24 of the package 10. As the conductive vias 30 shown in FIG. 2 are annular in shape, each outer connector 31 shown in FIG. 3 may include a semicircular recess 40 formed therein, which extends along the substantial height of the outer connector 31.

Figure 4:
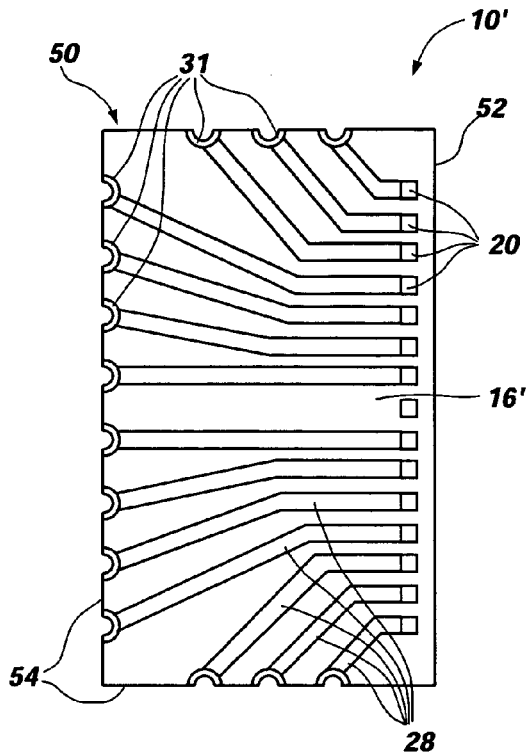
FIG. 4 is a plan view of a semiconductor device of the present invention which includes bond pads positioned adjacent to one edge thereof, which bond pads are redistributed to outer connectors on multiple peripheral edges of the semiconductor device.

Also, as shown in FIG. 4, teachings of the present invention may be applied to packages 50 that include semiconductor devices having peripheral bond pads 20 positioned on the active surface 18, adjacent to a single edge 52 of the semiconductor device 16'. The outer connectors 31 of the package 10' of which semiconductor device 16' is a part may be formed on one or more other peripheral edges 54 of the semiconductor device 16' and connected to corresponding bond pads 20 by metallization, such as conductive traces 28, as illustrated in FIG. 4. Of course, semiconductor devices with bond pads 20 arranged in other connection patterns are also within the scope of the present invention, as are packages 10 with outer connectors 31 that are arranged in connection patterns which differ from those illustrated in FIGS. 2–4.

Figure 5:
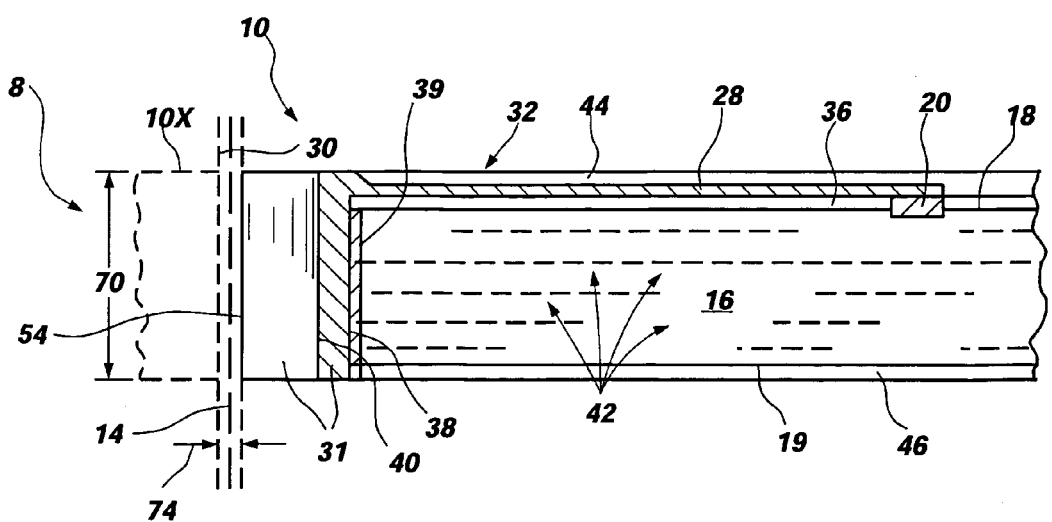
FIG. 5 is a cross-sectional view through a singulated semiconductor device of the present invention, taken along line 5—5 of FIG. 3.

FIG. 5 is a cross-sectional view of a portion of a package 10. Semiconductor device 16 of package 10 includes integrated circuits 42, although only a single integrated circuit 42 is schematically depicted in FIG. 5. Each integrated circuit 42 terminates at a bond pad 20 on the active surface 18 of the semiconductor device 16. An upper insulative layer, i.e., a dielectric layer 36, which is formed on the active surface 18, provides some protection for the underlying integrated circuit 42. Conductive traces 28 (again, only one is shown) are formed atop the dielectric layer 36 and extend from each bond pad 20 toward corresponding via through-holes 38, which are located on a street 12, 14 that defines a periphery of the semiconductor device 16. A second insulative layer, or dielectric coating 44, may be formed so as to cover at least a portion of the top 32 of package 10. The second dielectric coating 44 may be formed before or after the via through-holes 38 are formed. A conductive via 30, which includes a quantity of conductive material, such as one or more layers of metal, conductive or conductor-filled elastomer, or the like, deposited in or on the surfaces of a via through-hole 38, may be located within each via through-hole 38. An insulative lining 39 on the surfaces of each via through-hole 38 may electrically isolate each conductive via 30 from substrate blank 8. As conductive vias 30 are positioned on a street 12, 14 that is common to the package 10 and a neighboring, like package 10X on the substrate blank 8, each conductive via 30 may be temporarily shared between adjacent packages 10 and 10X. As depicted, the conductive via 30 will subsequently be severed to form two or more outer connectors 31, each of which includes a recess 40 formed therein. The back side 19 of the semiconductor device 16 may be at least partially coated with a lower protective insulative layer 46, as known in the art.

Turning now to FIGS. 6, 7, 8, and 9, various exemplary configurations of conductive traces 28, which are applied to the package tops 32 at the wafer level, are illustrated. The conductive traces 28, which may be considered to be redistribution metallization, extend generally laterally from each bond pad 20 to a desired outer connector 31 (see, e.g., FIGS. 4 and 5) location at a periphery of the package 10 and may be joined to conductive traces 28 of adjacent packages 10 at a street 12, 14 therebetween. In each of FIGS. 6–9, portions of two adjacent wafer-level packages 10D and 10E are shown with an intervening street 14. In FIG. 6, the conductive traces 28 have substantially uniformly widths and extend between bond pads 20 on the two packages 10D and 10E, intersecting the street 14 between packages 10D and 10E.

The conductive traces 28 may be formed by a wide range of processes known in the art. By way of example, one or more layers of conductive material, such as metal (e.g., aluminum, copper, gold, nickel, etc.), may be formed on package tops 32 by any suitable process, including, without limitation, chemical vapor deposition (CVD), physical vapor deposition (PVD) (e.g., sputtering or evaporation), electrolytic plating, electroless plating, and immersion plating techniques. While such a layer of conductive material may be formed before, simultaneously with, or following the introduction of conductive material into via through-holes 38 (see, e.g., FIGS. 10–13), in the embodiments that are shown in FIGS. 6–9, the layer of conductive material from which the conductive traces 28 are formed would be deposited prior to the formation of via through-holes 38 and, thus, prior to the introduction of conductive material into the via through-holes 38. Next, the layer of conductive material may be patterned, as known in the art, such as by use of mask and etch techniques.

In FIG. 10, the packages 10D, 10E of FIG. 6 are subjected to formation of via through-holes 38 at the intersections 66 of each conductive trace 28 with boundary line or street 14. It can be seen that when the widths 56 of conductive traces 28 are less than the diameters of the corresponding via through-holes 38, the conductive trace 28 will only contact a portion of the outer periphery of its corresponding conductive via 30 (FIG. 5). Thus, if desired, the conductive traces 28 may have increased widths 56 along a portion thereof or substantially the entire lengths thereof to more completely contact their corresponding conductive vias 30 (FIG. 5), as shown in FIGS. 7–9 and 11–13.

For example, in FIG. 7, each conductive trace 28' is shown with an enlargement 58', i.e., a region of increased width, at the intersection 66 of that conductive trace 28' with street 14. The width of enlargement 58' is sufficient to completely peripherally surround an adjacent end of a corresponding via through-hole 38 to be subsequently formed therethrough, as shown in FIG. 11.

In FIGS. 8 and 12, conductive traces 28" are shown as including diamond-shaped enlargements 58" at intersections 66 along a street 14 between two adjacent packages 10D, 10E. Adjacent diamond-shaped enlargements 58" may contact one another at areas 80, which are subsequently removed when packages 10D and 10E are severed from one another, thereby electrically isolating adjacent enlargements 58" from one another.

As depicted in FIGS. 9 and 13, the pattern of conductive traces 28''' may be formed to provide a conductive "street" 60 having boundary line or street 14 as a centerline. Portions of the street 60 may be etched or otherwise removed to form trace enlargements 58''', and via through-holes 38 formed at intersections 66, as shown in FIG. 13.

Referring again to FIG. 5, following the completion of conductive traces 28 on a package, the package top 32 may be covered with a protective dielectric coating 44, such as an adhesive-coated, dielectric film or tape, a quantity of dielectric polymer (e.g., by spin-on, screen printing, doctor blade, or other suitable, known techniques), spin-on-glass (SOG), or the like.

The via through-holes 38 may be formed by any of a variety of known processes, depending upon their heights 70 (i.e., the thickness of the substrate blank 8 and, thus, of the packages 10 in and between which the via through-holes 38 are to be formed) (see FIG. 5), as well as their diameters 64 and the pitch 68 at which the via through-holes 38 are spaced (see FIG. 10). By way of example only, the via through-holes 38 may be mechanically drilled (e.g., using multiple spindle machines as are used for forming holes in printed circuit boards or otherwise, as known in the art) or formed by known laser-drilling techniques, by mask and etch processes, or as otherwise known in the art. When mechanical drilling processes are used to form via through-holes 38, subsequent cleaning and/or deburring processes may be effected, as known in the art, to remove a "smear" of dust that may be present on the edges of the conductive traces 28 or an enlargement 58 due to the heat generated by drilling. Additionally, the via through-hole 38 may be etched back to fully expose the edges of the surrounding conductive trace 28 or enlargement 58. Of course, the usefulness of a particular method for forming via through-holes 38 in accordance with teachings of the present invention depends upon the desired dimensions of the via through-holes 38, including their diameters 64 and heights 70, or height aspect ratios.

When each conductive via 30 is to be bisected, or severed into two outer connectors 31 the number of via through-holes 38 to be formed is one-half the number of outer connectors 31 to be formed.

Once the via through-holes 38 are formed, exposed semiconductive material at the surfaces thereof may be coated with an insulative lining 39. The insulative lining 39 may be formed by known processes, such as by exposure of the surfaces of via though-holes 38 to oxidizing conditions, deposition of an insulative material (e.g., silicon dioxide, silicon nitride, silicon oxynitride, etc.) onto the surfaces of via through-holes 38, or any other suitable, known process.

Figure 14:
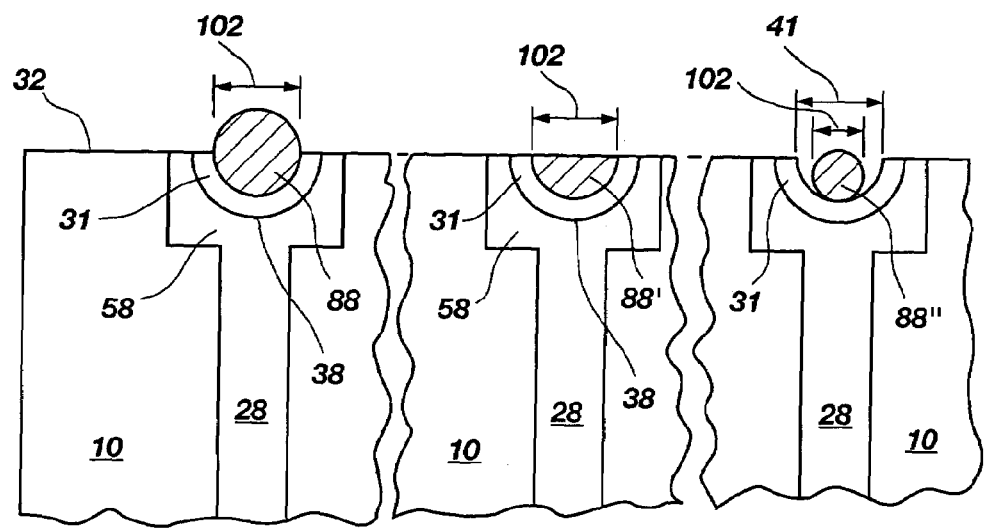
FIG. 14 is an enlarged plan view of a portion of the boundary between adjacent semiconductor devices of FIG. 11, illustrating the effect of singulation of the two semiconductor devices from one another to form outer connectors in accordance with teachings of the invention.
Figure 14:
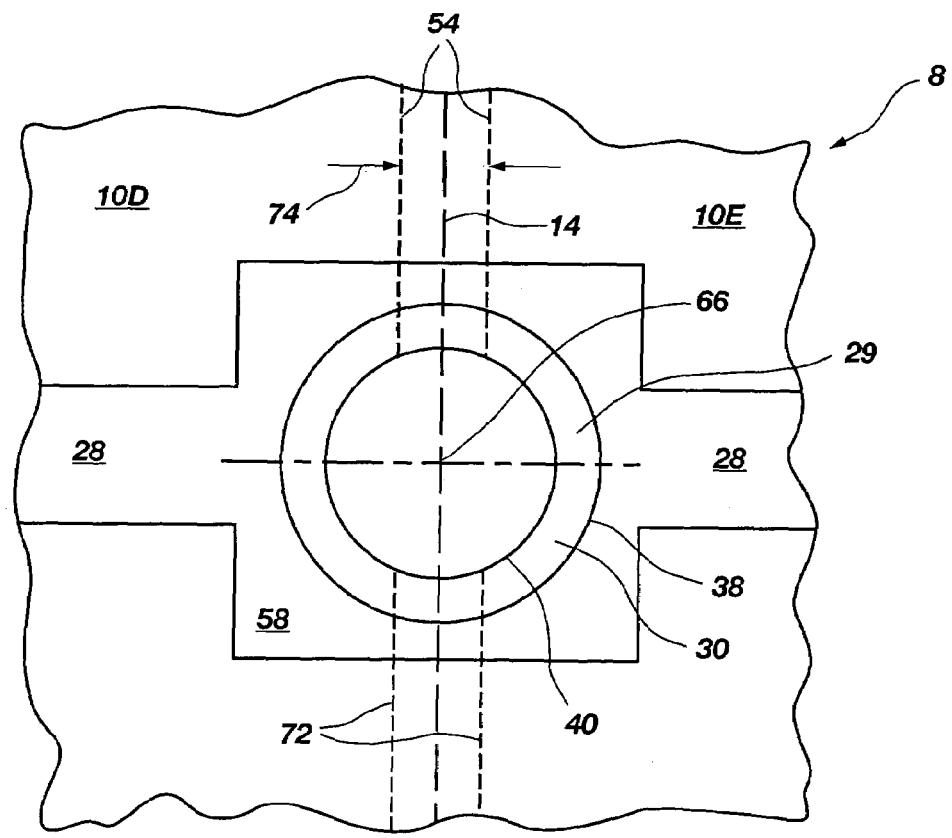

As depicted in FIG. 14 with respect to packages 10D and 10E that are still structurally connected to one another, or at the wafer level, a conductive via 30 may be formed in a via through-hole 38 by introducing a quantity of conductive material 29 onto at least the surfaces of each via through-hole 38. The conductive material 29 contacts at least edge regions of a conductive trace 28 or enlargement 58 located adjacent to an opening of that via through-hole 38. While FIG. 14 depicts the conductive vias 30 as being annular in shape, the conductive vias 30 may optionally be substantially solid structures. The shapes of the conductive vias 30 may result from the methods by which conductive material 29 is introduced into the via through-holes 38. By way of example only, electroless deposition, immersion deposition, electrolytic deposition, chemical vapor deposition (CVD), or physical vapor deposition (PVD) (e.g., sputtering, evaporation, etc.) techniques may be employed. Alternatively, via through-holes 38 may be filled with conductive material 29 in the form of solder or another metal or metal alloy, conductive or conductor-filled elastomer, or other conductive materials which have properties that make them suitable for use as outer connectors 31 (e.g., low contact resistance with the materials of adjacent conductive structures, good adhesion to adjacent materials, etc.). Examples of conductive materials 29 that may be used to form conductive vias 30 and, thus, outer connectors 31 (FIGS. 3–5) include, but are not limited to, nickel-plated copper, aluminum, and other solder-compatible materials.

As shown in FIG. 14, the formation of conductive vias 30 is followed by singulation of adjacent packages 10D and 10E from each other and from other packages that are carried by the substrate blank 8. In this invention, the singulation process serves another purpose, namely, to sever each of a series of conductive vias 30 into portions and to thereby form outer connectors 31 (FIGS. 3–5) on at least one peripheral edge 22, 24 of each of the severed, adjacent packages 10D and 10E. The outer connectors 31 may be semicylindrical, as shown in FIG. 15, or semicircular if completely filled, as depicted in FIG. 16, depending, of course, upon the degree to which the via through-hole 38 is coated or filled with conductive material 29. Singulation may be accomplished by cutting with a wafer saw, for example. Wafer saws have a finite kerf width 74. Singulation of packages 10 from the substrate blank 8 will produce separate packages 10 with kerf edges 72. The amount of material removed between adjacent packages 10, as well as the amount of material removed from each of the conductive vias 30, is defined, in part, by the kerf width 74. Accordingly, the width dimension of each outer connector 31 may be defined, at least in part, by the kerf width 74 of a saw blade (not shown). Likewise, the width of each recess 40 formed in an outer connector 31 may be at least partially defined by the kerf width 74. The upper surface 76 and lower surface 78 of each outer connector 31 may be substantially planar and have dimensions that facilitate attachment, by solder, conductive or conductor-filled elastomer, or otherwise, to a contact area, such as a conductive land or a contact area of a lead, of another semiconductor device component, such as a carrier (e.g., an interposer, a circuit board, leads, etc.), another packaged or bare semiconductor device, or the like.

Turning again to FIG. 12, it can be seen that, in singulation of packages 10D and 10E along street 14, the kerf width 74 may also remove areas 80 where enlargements 58" of adjacent conductive traces 28" are continuous with one another, such as the corners of the diamond-shaped enlargements 58" depicted in FIG. 12, thus separating and electrically isolating adjacent conductive traces 28" from each other. Accordingly, when the kerf width 74 is sufficient to mechanically separate adjacent enlargements 58", a further etching step to separate the enlargements 58" from each other is unnecessary.

A package 10 with castellated edges 22, 24 and outer connectors 31 of the type described herein has an extremely low profile, which may be only slightly larger than that of the semiconductor device 16 of such a package 10. Furthermore, such a package 10 has a minimal footprint, which closely resembles the footprint of the semiconductor device 16 thereof. In addition, due to its minimized size, the lengths of conductive traces 28 that are required to redistribute the input/output provided by bond pads 20 to outer connectors 31 are minimized, facilitating the provision of a package 10 with electrical characteristics and signal integrity that are superior to those of existing semiconductor device packages.

In another aspect of the present invention, a plurality of packages 10 may be assembled to form a so-called multichip module (MCM). In a stacked MCM according to the present invention, packages 10 may be positioned adjacent to one another with little or no spacing therebetween, as may result from the use of discrete conductive elements, such as solder balls, between adjacent packages, and with a minimized footprint, in contrast to the expanded footprints that are required when laterally extending, intermediate conductive elements, such as bond wires, conductive tape-automated bonding (TAB) elements carried upon a dielectric polymer film, leads, or the like, are used to provide electrical connections in conventional MCMs.

Figure 17:
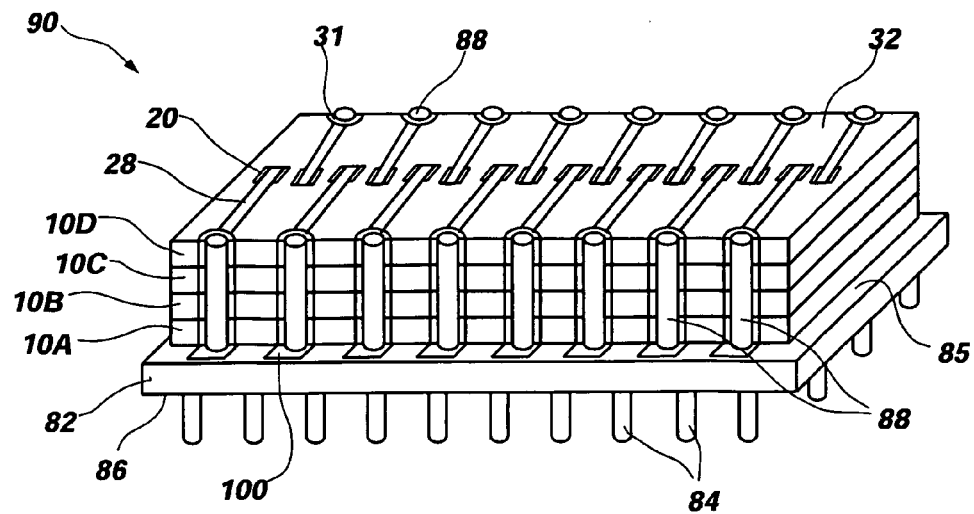
FIG. 17 is a perspective view of a multichip module including stacked semiconductor devices of the present invention.
Figure 18:
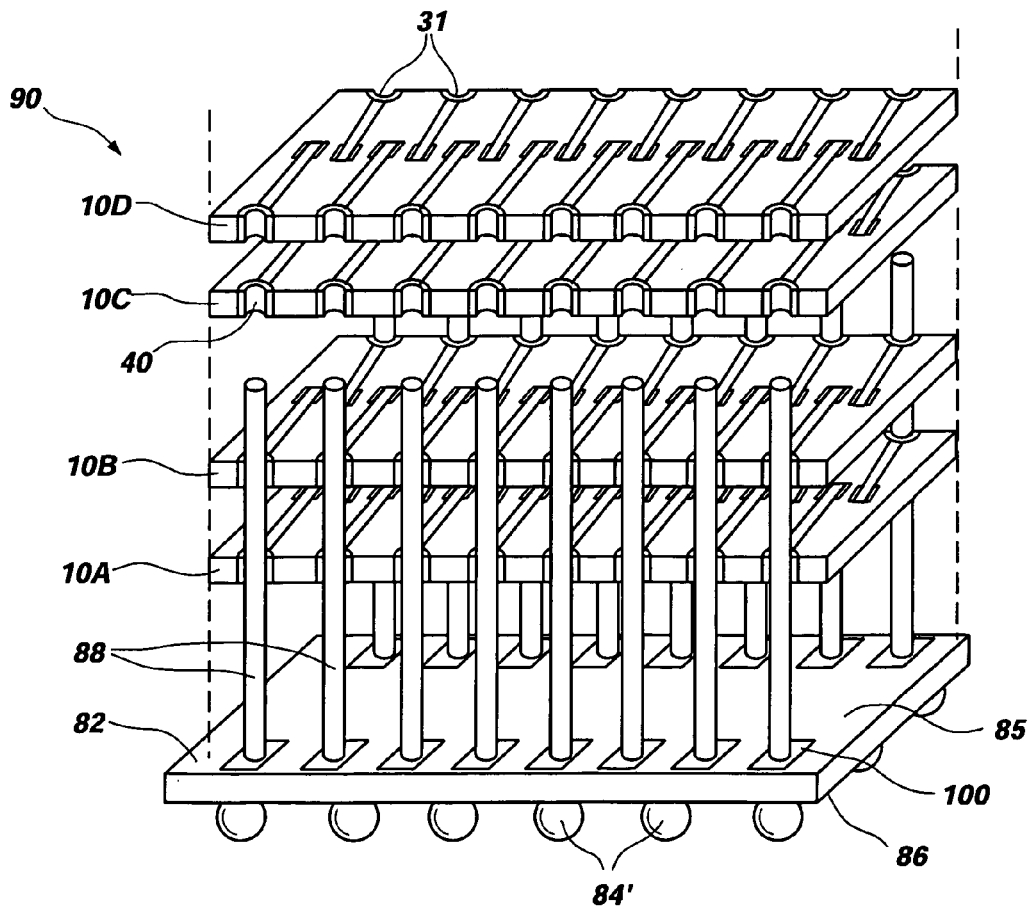
FIG. 18 is an exploded perspective view of a multichip module that includes stacked semiconductor devices according to the present invention.

As depicted in FIGS. 17, 18 and 19, an exemplary multichip module 90, or semiconductor device assembly, of the present invention is shown. While the illustrated multichip module 90 includes four packages 10A–10D in stacked arrangement, multichip modules with other arrangements and with other numbers of packages 10 are also within the scope of the present invention. By way of example only, stacked multichip modules 90 that include a greater number of packages 10 would be particularly useful for high-capacity memory.

It will be appreciated that the multichip module 90 shown in FIGS. 17 and 18 will comprise a stack of semiconductor packages 10 having an identical pattern of outer connectors 31. However, depending upon the particular package construction, same-width but shorter packages having fewer outer connectors 31 may be incorporated in the multichip module 90, provided that the partial pattern of outer connectors 31 fits within the larger connector pattern.

As shown, the packages 10 may be electrically interconnected and physically supported by way of conductive columns 88 that are configured and arranged to be at least partially received within aligned recesses 40 of corresponding sets of outer connectors 31 of the stacked packages 10. Conductive columns 88 are elongate members that may be formed from a conductive material (e.g., aluminum, copper, etc.) which will substantially retain their shapes when the outer connectors 31 of packages 10 are positioned adjacent thereto. Thus, each conductive column 88 acts as a common lead for each of the outer connectors 31 of a set.

Each conductive column 88 is secured to (e.g., by solder, reflowing a portion thereof to secure the same to a terminal, etc.) and protrudes from a corresponding conductive member 100 (e.g., a terminal, conductive material-lined recess, etc.) of a support substrate 82 of the multichip module 90. In the exemplary embodiment of a circuit board (e.g., FR-4 resin, BT resin, etc.) type support substrate 82 depicted in FIGS. 17, 18, and 19, the conductive columns 88 are shown as being mounted in apertures 98 formed in the support substrate 82. The support substrate 82 may alternatively comprise an interposer (which may be formed from ceramic, glass, plastic, insulator-lined silicon, etc.), leads, another semiconductor device, a test substrate, or any other known, suitable type of substrate. Each conductive column 88 is electrically connected to a portion of a corresponding conductive trace 92 that is located at or proximate to the end of the aperture 98 opposite that from which the conductive column 88 protrudes, which conductive trace 92 is carried by the bottom surface 86 of the support substrate 82. Each conductive trace 92 leads to a corresponding conductive structure, such as leads, leadless chip carrier (LCC) terminals, plug-in type connectors, or discrete conductive elements (i.e., balls 84' (FIGS. 18, 19), bumps, pillars, columns, pins 84 (FIG. 17), or other structures or conductive material), which are shown as being arranged in a so-called ball grid array (BGA) connection pattern. In FIG. 17, the conductive structures are shown as an array of pins 84, or "pin-grid-array" (PGA), while in the exploded view of FIG. 18, a ball-grid-array (BGA) of solder balls 84' is depicted. As an alternative to including conductive traces 92 that are carried by the bottom surface 86 of the support substrate 82, conductive traces may be carried on the upper surface 85 of the support substrate 82, internally within the support substrate 82, or in some combination thereof, in which case conductive vias may be positioned at one or more locations along the lengths of the conductive traces 92.

As an example of a method for forming the conductive columns 88, a wire (e.g., a gold or aluminum wire) may be drawn by use of a wire bonding capillary, as known in the art. Such a wire may have a generally circular cross-section, although conductive columns 88 having any other suitable cross-section, taken transverse to the lengths thereof, are also within the scope of the present invention. By way of example only, and as shown in FIG. 21, the cross-section of a conductive column 88' incorporating teachings of the present invention may be semicircular. Such a conductive column 88' could be used to form an assembly of stacked packages 10 that is substantially chip-scale with respect to both footprint and profile.

As noted above, the conductive column 88' may have transverse cross-sectional dimensions (e.g., a diameter 102) that substantially match or are slightly smaller than the complementary dimensions (e.g., a diameter 41; FIG. 22) of a recess 40 formed in the outer connector 31 to which the conductive column 88 corresponds. This is illustrated in the package 10 of FIG. 20. As depicted in FIG. 22, a castellation column 88" may alternatively have a cross-section which is circular but with a diameter 102 less than the diameter 41 of the recess 40 formed in the corresponding outer connector 31.

As shown in FIG. 19, slippage of the conductive column 88 in its corresponding aperture 98 may be avoided by use of a stop collar 94 on the conductive column 88, and by solder attachment to adjacent portions of conductive traces 92 on the bottom surface 86 of the support substrate 82.

If desired (e.g., in packages that include outer connectors 31 arranged along only one or two adjacent peripheral edges 22, 24 thereof), conductive columns 88 may be secured to their outer connectors 31. One example of the manner in which a conductive column 88 may be secured to a set of corresponding outer connectors 31 includes the use of a conductive adhesive, such as solder, another metal or metal alloy, a conductive or conductor-filled elastomer, or the like, which may be positioned between a conductive column 88 and each of its corresponding outer connectors 31, around an outer periphery of the conductive column 88 and in contact with lateral edges of each of the outer connectors 31 that corresponds thereto, or in a combination of these locations. Optionally, the conductive columns 88 may be coated with tin to enhance connection to the outer connectors 31 in this manner. As another example, a nonconductive material may be disposed around a surface of each conductive column 88 that does not contact outer connectors 31, as well as to a peripheral edge 22, 24 of each package 10 of the multichip module 90, to maintain contact and, thus, an electrical connection between each conductive column 88 and its corresponding outer connectors 31.

Of course, when support substrate 82 comprises a test substrate, it may not be desirable to bond or otherwise permanently secure the conductive columns 88 to their corresponding outer connectors 31, as temporary, reversible electrical connections are desired.

Following assembly of the support substrate 82 with all the packages 10 in the stack and the establishment of contact between conductive columns 88 and corresponding sets of outer connectors 31, the conductive columns 88 may be cut, or trimmed, to remove any excess portion extending beyond the uppermost package 10. The conductive columns 88 may alternatively be provided with a length that corresponds to the height at which packages 10 are to be stacked in the multichip module 90.

As described above, the multichip module 90 may be readily fabricated using processes and equipment which are widely used or known in the electronics industry. The package 10 of the present invention may have a total thickness of less than about 1 mm, making the package 10 suitable for use in compact electronic devices, such as cellular telephones, handheld computers, and portable computers, where such low profile packages are required or desired. The multichip module 90, of the invention will likewise have a relatively low profile, making it suitable for the same types of devices.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A semiconductor device package, comprising:
a semiconductor device including at least one bond pad on an active surface thereof and at least one recess in a peripheral edge thereof;
at least one outer connector corresponding to the at least one bond pad, the at least one outer connector positioned at least partially within the at least one recess and having a height that extends substantially along a height of the peripheral edges, the at least one outer connector comprising:
opposite surfaces exposed at the active surface and a back side of the semiconductor device: and
a recess extending substantially from one of the opposite surfaces to another of the opposite surfaces: and
at least one conductive trace extending between the at least one bond pad and the at least one outer connector.

2. The semiconductor device package of claim 1, further comprising:
an insulative layer positioned beneath at least the at least one conductive trace.

3. The semiconductor device package of claim 1, further comprising:
an insulative layer positioned over at least the at least one conductive trace and the at least one bond pad.

4. The semiconductor device package of claim 1, further comprising:
a back side insulative layer substantially covering a back side of the semiconductor device.

5. The semiconductor device package of claim 1, wherein the recess of the at least one outer connector has a semicylindrical shape.

6. The semiconductor device package of claim 1, comprising a plurality of outer connectors.

7. The semiconductor device package of claim 6, comprising a plurality of conductive traces that corresponds to at least some of the plurality of outer connectors.

8. The semiconductor device package of claim 7, wherein each of the plurality of conductive traces establishes electrical communication between a bond pad of the semiconductor device and a corresponding outer connector of the plurality of outer connectors.

9. The semiconductor device package of claim 6, wherein each of the plurality of outer connectors is positioned on a single peripheral edge of the semiconductor device.

10. The semiconductor device package of claim 6, wherein outer connectors of the plurality of outer connectors are positioned adjacent to at least two peripheral edges of the semiconductor device.

* * * * *

UNITED STATES PATENT AND TRADEMARK OFFICE
CERTIFICATE OF CORRECTION

PATENT NO.         : 7,115,984 B2                                         Page 1 of 1
APPLICATION NO. : 10/736244
DATED              : October 3, 2006
INVENTOR(S)        : Poo et al.

It is certified that error appears in the above-identified patent and that said Letters Patent is hereby corrected as shown below:

In column 14, line 15, in Claim 1, delete "edges," and insert -- edge, --, therefor.

In column 14, line 18, in Claim 1, delete "device:" and insert -- device; --, therefor.

In column 14, line 20, in Claim 1, delete "surfaces:" and insert -- surfaces; --, therefor.

Signed and Sealed this

Fifteenth Day of April, 2008

JON W. DUDAS
*Director of the United States Patent and Trademark Office*